United States Patent [19]

Chiang

[11] Patent Number: 5,276,359
[45] Date of Patent: Jan. 4, 1994

[54] CURRENT-INPUT TYPE INTERFACE CIRCUIT OF A MOUSE

[76] Inventor: Ting-Chi Chiang, 6th Fl., No. 4, Fu Shun St., Taipei, Taiwan

[21] Appl. No.: 12,323

[22] Filed: Feb. 2, 1993

[51] Int. Cl.$^5$ .............................................. H03K 3/42
[52] U.S. Cl. .................................... 307/311; 323/315; 307/497
[58] Field of Search ............... 307/311, 494, 496, 497, 307/530; 323/315, 316; 330/257

Primary Examiner—John S. Heyman
Assistant Examiner—Shawn Riley
Attorney, Agent, or Firm—Hedman, Gibson & Costigan

[57] ABSTRACT

A current input interface circuit of a mouse circuit includes a first current mirror circuit connected to a second current mirror circuit permitting the mouse signal inputted thereto by the current parameter instead of voltage parameter thus constituting a current comparator.

4 Claims, 2 Drawing Sheets

CURRENT-INPUT TYPE INTERFACE CIRCUIT OF A MOUSE

BACKGROUND OF THE INVENTION

This invention relates to a current-input type interface circuit of a mouse, especially for one interface circuit in which current parameters instead of voltage parameters are utilized to constitute the input parameters for a mouse.

The presently available mice all have a ball to frictionally drive two rollers to respectively correspond to the shift of the mouse in X and Y directions. Each roller coaxially carries a photogrid (optic interrupter) which co-rotates with the roller, thus the X and Y displacements can be photoelectrically converted into corresponding electrical signals. Two photo-coupling sensors each cooperates with one of the corresponding roller to sense the X displacement or Y displacement.

Referring to FIG. 4, either of the photo-coupling sensors comprising a light emitting diode (LED) 51 and a photo-transistor 52, which are respectively arranged at the opposite sides of the photogrid device, generates pulsative signal similar to a train of pulses. The frequency of the pulse-like signal represents the displacement of X-axis (Y-axis), thus reflecting the displacement and the direction of the mouse. Referring to FIG. 3, a mouse-input sensing circuit 53 receives the pulse-like signal from the photo-transistor 52 and transmits the signal to a control/processing circuit 54 for converting the pulse-like signal into a standard digital signal. An output circuit 56 is provided to promote the signal level of the digital signal from the control/processing circuit 54 and to give an output signal receivable/readable by a computer.

The mouse-input sensing circuit 53 used at the present time comprises a resistor R and an inverter 531, as shown in FIG. 5. The resistor R is connected between the emitter electrode of the photo-transistor 52 and a grounding point. The input of the inverter 531 is also connected to the emitter electrode of the photo-transistor 52. When the photo-transistor 52 receives the light emitted from the diode 51, an electrical signal is produced, so a potential is obtained across the resistor R. The signal is further inverted by means of the inverter 531 and outputted at the output terminal 0/P for driving subsequent circuits. Therefore, the mouse-input sensing circuit 53 cooperates with the photo-transistor 52 to generate required voltage to drive the subsequent circuits. However, the mouse-input sensing circuit 53 is integrated in a mouse control chip, the manufacturing process of which affects the stability of the input voltage and the response speed as described below.

Due to the manufacturing process of the integrated circuit, the transition point of the inverter 531 has a relatively large range of errors; also the receiving characteristic of each photo-transistor 52 has its individual difference; the conducting current of the photo-transistor is relatively small (possibly lower than 5 micro-ampere), thus causing the insufficient tolerance of the transition of the inverter 531. For example, if the transition point of the inverter 531 is 1.4 volts, the resistor R should be 280 K-ohm during the minimum current (5 micro-ampere). The relatively high resistance (280 K-ohm) of the resistor R requires a relatively large area in the integrated circuit, contrary to the trend of miniaturization for integrated circuit. Moreover, due to the offset of the manufacturing process, the practical resistance might have an error up to 20%, i.e., the real resistance of the resistor R might vary in the range between 233 K-ohm and 336 K-ohm. If the resistance is 233 K-ohm, the output voltage is only 1.16 volts, which is not enough to enable the inverter 531 to transit its status. One could solve this problem by increasing the resistance of the resistor R. However, the increased resistance will lead to reduction of the $V_{CE}$ value of the photo-transistor to a too small value, thus causing the transistor 52 to enter its saturation status and decreasing its response speed. For example, when the photo-transistor 52 receives a total bombardment of the emitted light, the current therethrough might be as high as 40 to 50 micro-ampere. If the resistor is 280 K-ohm (notice that the 280 K-ohm falls in the above mentioned range between 233 K-ohm and 336 K-ohm), the potential across the resistor R is up to 11.2 volts, which is greater than the source voltage 5-volt. Therefore, the voltage will actually not undergo the above situation, but remain in a certain equilibrium point, which renders the $V_{CE}$ relatively small, thus causing the photo-transistor 52 to enter its saturation status. At this time, if the photo-grid device rotates in a too high speed, then the photo-transistor will not be able to catch up to timely respond with a switching over (from ON to OFF, or vise versa), thus causing the malfunction (wrong interpretation) of the mouse. Therefore, the resistance of the resistor R of the conventional voltage-input sensing circuit must neither be too great nor too small, and must be restricted in a narrow range. However, such an accuracy in resistance is practically very difficult for circuit integration.

SUMMARY OF THE INVENTION

It is an object of the present invention to provide a current input interface circuit of a mouse circuit to obviate the aforesaid disadvantages. Since the resistor R of high resistance is responsible for the difficulty of the practical integration of the sensing circuit 53, to solve the problem. The use of such a high resistance must be avoided. It is desired that a current input interface circuit which is to substitute the sensing circuit 53 has a resistance lower than 10 K-ohm.

These and additional objects, if not set forth specifically herein, will be readily apparent to those skilled in the art from the detailed description provided hereunder, with appropriate reference to the accompanying drawings.

DETAILED DESCRIPTION OF THE PREFERRED EMBODIMENTS

Figure 1:
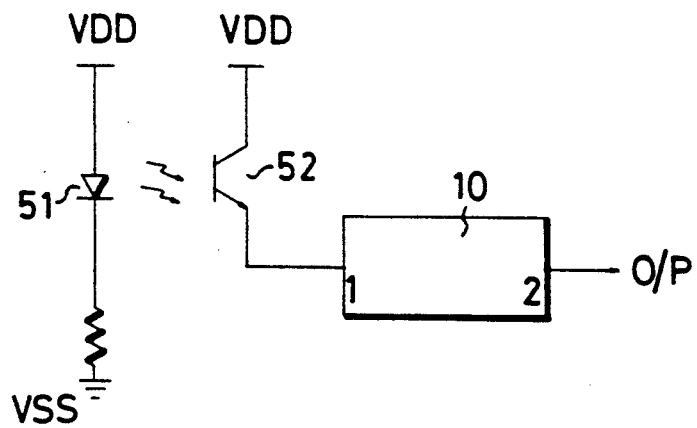
FIG. 1 is a schematic block diagram of the present invention.
Figure 5:
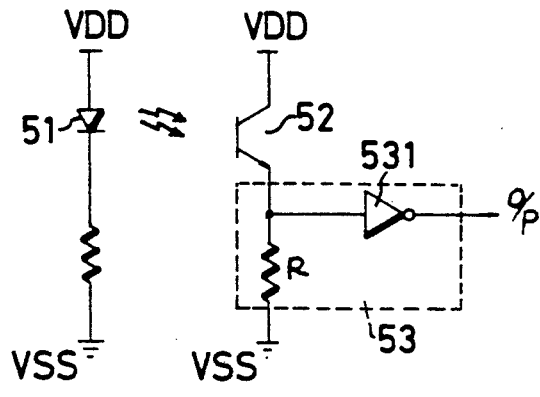
FIG. 5 illustrates a conventional photo-coupling sensor connected to a conventional mouse-input sensing circuit.
Figure 3:
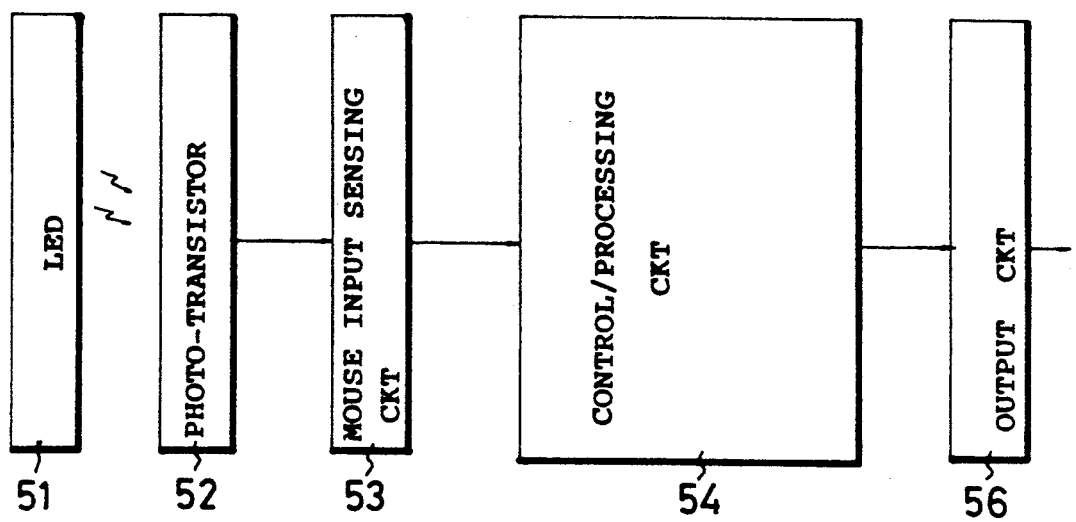
FIG. 3 is a conventional control circuit of a mouse.
Figure 4:
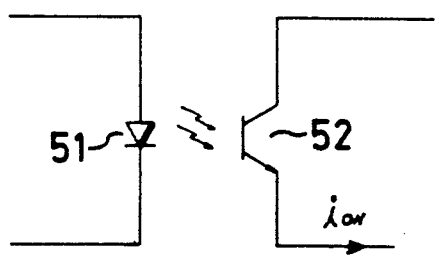
FIG. 4 is a conventional photo-coupling sensor.

Referring to FIGS. 1 and 5, a current input interface circuit 10, which is intended to replace the conventional mouse-input sensing circuit 53, is connected to the emitter electrode of the photo-transistor 52. The current input interface circuit 10 directly receives the electrical current signal of the transistor 52 at an input node 1 thereof and responsively generates a corresponding driving signal at an output node 2 thereof. The input node 1 is used for current input and the output node 2 is used for voltage output. A power source VDD represents a logical high and a grounding point VSS represents a logical low for all figures herein.

Figure 2:
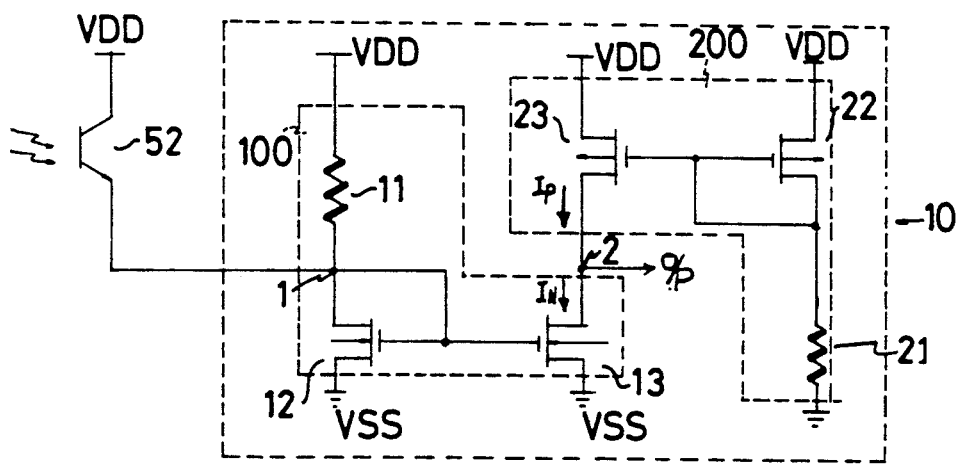
FIG. 2 is a circuit diagram showing current-input interface circuit of the present invention.

Referring to FIG. 2, the current input interface circuit 10 is basically a current comparator comprising a first current mirror circuit (current source) 100 and a second current mirror circuit 200. The output of both current mirror circuits 100 and 200 are connected together to form an output O/P. The first current mirror circuit 100 comprises a first resistor 11, a first transistor 12, and a second transistor 13. The first resistor 11 has one end connected to the power source VDD and the other end connected to the input node 1. The first transistor 12 and the second transistor 13 are preferably N-type metal oxides field effect transistors (MOSFETs), the drain electrodes of which are respectively connected to the input node 1 and the output node 2, the gate electrodes of which are connected together, and the source electrodes of which are connected to ground VSS. The drain electrode of the first transistor 12 is electrically connected to the gate electrode thereof.

The second current mirror circuit 200 comprises a second resistor 21, a third transistor 22, and a fourth transistor 23. The third transistor 22 and the fourth transistor 23 are P-channel MOSFETs, the drain electrodes of which are respectively connected to the second resistor 21 and the output node 2, the gate electrodes of which are connected together, and the source electrodes of which are connected to the power source VDD. The drain electrode of the third transistor 22 is electrically connected to the gate electrode thereof. One end of the second resistor 21 is grounded and the other end is connected to the drain electrode of the third transistor 22 as mentioned above.

No input current enters the input interface circuit 10 when the photo-transistor 52 receives no light from the light emitting diode 51, i.e., the photo-grid device intercepts the emitted light from the diode 51. In this situation, a first current $I_{12}$ passes through the first transistor 12. The value of $I_{12}$ is determined by the impedance of the first transistor 12 and the first resistor 11. The first current $I_{12}$, when applied to the gate of transistor 13 to trigger the latter, will enable a second current $I_N$ to pass through the second transistor 13 according to a so called "mirror effect." The current $I_N$ is relevant to the ratio of the current $I_{12}$ flowing through the first transistor 12. Suppose the ratio of the second current $I_N$ to the first current $I_{12}$ is $A_{21}$, then $I_N = A_{21} I_{12}$. Therefore, $I_N$ is determined by the first resistor 11, the first transistor 12, and the second transistor 13. Similarly, if a third current $I_{22}$ passes through the third transistor 22, the value $I_{12}$ is determined by the impedance of the third transistor 22 and the second resistor 21. The third current $I_{22}$ enables a fourth current $I_P$ to pass through the fourth transistor 23 according to "mirror effect." Suppose the ratio of the fourth current $I_P$ to the third current $I_{22}$ is $B_{43}$, then $I_P = B_{43} I_{22}$. $I_P$ is determined by the second resistor 21, the third transistor 22, and the fourth transistor 23. Suppose, $I_P > I_N$ and $\delta I = I_P - I_N$, then the output voltage at the output node is approximately equal to the power source VDD. Thus, when there is no responsive output from the photo-transistor 52, the output of the current input interface 10 is high level.

If the photo-transistor 52 receives a light through the photo-grid device, and is triggered, a current $I_{ON}$ is allowed to pass through the photo-transistor 52 to the input node 1, and adds to the first current $I_{12}$, thus changing the mirror current $I_N$ from ($A_{21} I_{12}$) to $A_{21} \cdot (I_{12} + I_{ON})$. The new $I_N$ is greater than the $I_P$, thus causing a logical low output VSS at the output node 2, and results in the transition of the output node 2 from logical high to logical low.

As mentioned previously, the first current mirror circuit 100 and the second current mirror circuit 200 together constitute a current comparator. A transition current $I_{threshold}$ of the current comparator is:

$$I_{threshold} = 1/A_{21} \, \delta I)$$

where
$\delta I = I_P - I_N \, A_{21} = I_N / I_{12}$

Since $I_N$ is determined by the first resistor 11, the first transistor 12, and the second transistor 13, whereas $I_P$ is determined by the second resistor 21, the third transistor 22, and the fourth transistor 23 as mentioned, the transition current $I_{threshold}$ is determined by the resistors 11, 21, and the transistors 12, 13, 22, 23.

Moreover, one can select appropriate impedance of the first resistor 11 and the first transistor 12, thus making the input impedance of the input interface circuit 10 less than 10 K-ohm. If the input impedance is set to 10 K-ohm, then even when the input current is in maximum value, say 50 micro-ampere, the input interface circuit 10 still has only a voltage drop of about 0.5 volts, which is not great enough to enable the photo-transistor 52 to enter saturation status. Therefore, the input interface circuit 10 can prevent the photo-transistor 52 from entering its saturation, thus ensuring a high responsive speed when compared with the conventional mouse circuit. The transition current $I_{threshold}$ can be adjusted by changing the impedance values of the resistors 11, 21, and transistors 12, 13, 22, 23, thus facilitating manufacturing in the integrated circuit and promoting the response speed and stability.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A current input interface circuit (10) for a mouse, said mouse comprising two photo-coupling device, each including a light emitting element (51) and a light receiving means (52) to receive the light from said light emitting element (51), the input of said current input interface being connected to the output of said light receiving means (52), said current input interface circuit (10) comprising a first current mirror circuit (100) and a second current mirror circuit (200), both together constituting a current comparator, said first current mirror circuit (100) comprising a first resistor (11), a first transistor (12), and a second transistor (13); said second current mirror circuit (200) comprising a second resistor (21), a third transistor (22), and a fourth transistor (23), an input (1) of said interface circuit (10) being respectively connected to a first end of said resistor (11), the gate/base of said second transistor (13), the gate/base and a first non-gate/non-base electrode of said first transistor (12), an output (2) of said interface circuit (10) being respectively connected to a first non-gate/non-base electrode of said second transistor (13) and of said fourth transistor (23), a first end of said second resistor (21) being respectively connected to the gate/base of said fourth transistor (23), the gate/base and a first non-gate/non-base electrode of said third transistor (22), the gates/bases of said first and second transistors (12, 13), and the gate/bases of said third and fourth transistors (22, 23) being respectively connected with each other, a second end of said first resistors (11), a second non-gate/non-base electrode of said third transistor (22) and a second non-gate/non-base electrode of said fourth transistor (23) being connected to a power supply (VDD), a second non-gate/non-base electrode of said first transistor (12), a second non-gate/non-base electrode of said second transistor (13) and a second end of said second resistor (21) being grounded, said interface being such that a zero voltage at said input (1) causes a logical high voltage at said output (2), and when said light receiving means (52) is optically triggered, a logical low voltage is generated at said output (2).

2. A current input interface circuit (10) as claimed in claim 1, wherein said first and second transistors (12, 13) are N-channel MOSFETs, and said third and fourth transistors (22, 23) are P-channel MOSFETs.

3. A current input interface circuit (10) as claimed in claim 2, wherein the input impedance of said input terminal (1) is determined by said first resistor (11) and said first transistor (12), said input impedance being selected at a value lower than 10 K-ohm, such that even when said input current is up to a maximum value thereof, said photo-transistor (52) is still not in saturation status.

4. A current input interface circuit (10) of a mouse circuit as claimed in claim 1, wherein said input current has a transition value ($I_{threshold}$) determined by said resistors (11, 21) and said transistors (12, 13, 22, 23).

* * * * *